US010863646B1

(12) United States Patent
Rampey et al.

(10) Patent No.: US 10,863,646 B1
(45) Date of Patent: Dec. 8, 2020

(54) MODULAR DATA CENTER SUPPORT RACK SYSTEM AND INSTALLATION METHOD

(71) Applicant: M.C. Dean, Inc., Tysons, VA (US)

(72) Inventors: Walter Edward Rampey, Leesburg, VA (US); Qiang Gu, Tysons, VA (US)

(73) Assignee: M.C. DEAN, INC., Tysons, VA (US)

( * ) Notice: Subject to any disclaimer, the term of this patent is extended or adjusted under 35 U.S.C. 154(b) by 0 days.

(21) Appl. No.: 16/515,714

(22) Filed: Jul. 18, 2019

(51) Int. Cl.
| H05K 7/14 | (2006.01) |
| G06F 1/18 | (2006.01) |
| H05K 5/02 | (2006.01) |
| A47F 5/10 | (2006.01) |
| A47B 61/02 | (2006.01) |

(52) U.S. Cl.
CPC ........... *H05K 7/1491* (2013.01); *A47B 61/02* (2013.01); *A47F 5/108* (2013.01); *G06F 1/181* (2013.01); *G06F 1/189* (2013.01); *H05K 5/0247* (2013.01)

(58) Field of Classification Search
CPC .... H05K 7/1491; H05K 5/0247; G06F 1/181; G06F 1/189; A47F 5/10; A47F 5/108; A47B 45/00; A47B 96/025; A47B 53/00; A47B 61/02
USPC ............ 211/191, 193, 175, 60.1, 189, 86.01; 211/87.01; 414/286, 277, 458; 361/679.01
See application file for complete search history.

(56) References Cited

U.S. PATENT DOCUMENTS

| 3,393,807 A * | 7/1968 | Sylvester ........... B29D 30/0016 |
| | | 211/24 |
| 3,459,326 A * | 8/1969 | Betjemann ........... B65D 88/005 |
| | | 220/1.5 |
| 3,561,608 A * | 2/1971 | Weider ..................... B65G 1/02 |
| | | 211/191 |
| 3,802,574 A * | 4/1974 | Weider ................. A47B 47/027 |
| | | 211/134 |
| 3,848,747 A * | 11/1974 | Thompson ........... A47B 47/027 |
| | | 211/194 |
| 4,029,211 A * | 6/1977 | Marshall ................ A47B 61/02 |
| | | 211/104 |

(Continued)

FOREIGN PATENT DOCUMENTS

| CN | 203596985 U | 5/2014 |
| CN | 206100760 U | 4/2017 |

*Primary Examiner* — Jennifer E. Novosad
(74) *Attorney, Agent, or Firm* — Roberts Calderon Safran & Cole P.C.

(57) ABSTRACT

A modular data center support rack system and installation method whereby system includes a plurality of modular support racks formed from bracket-like rack members that support data center electrical power components, and a transportable fixture that detachably holds the rack members into an assembly position. The transportable fixture remains detachably connected to the assembled modular support rack during the transportation thereof to an installation location to reinforce the modular support rack. Each modular support rack includes an arrangement of data center electrical power supply components that are registrable with and connectable the data center electrical power supply components on another of the modular support racks. In the installation method, the modular support racks are serially interconnected into an appropriate electrical supply configuration for a row of servers located beneath the row of modular support racks.

20 Claims, 8 Drawing Sheets

(56) References Cited

U.S. PATENT DOCUMENTS

| | | | | |
|---|---|---|---|---|
| 4,111,309 A * | 9/1978 | Henry | A47B 61/02 | 211/104 |
| 4,261,470 A * | 4/1981 | Dolan | F16B 12/36 | 108/55.1 |
| 4,290,370 A * | 9/1981 | Gallagher | B65D 19/385 | 108/53.5 |
| 4,444,323 A * | 4/1984 | Travis | A47B 57/52 | 108/108 |
| 4,579,501 A * | 4/1986 | Fox | B66F 9/183 | 414/347 |
| 4,976,092 A * | 12/1990 | Shuert | B42F 17/12 | 108/55.1 |
| 5,340,268 A * | 8/1994 | Dowty | B66F 9/18 | 414/608 |
| 5,348,149 A * | 9/1994 | McCarthy | A47B 81/00 | 108/53.1 |
| 5,716,186 A * | 2/1998 | Jensen | A47F 5/108 | 187/244 |
| 5,794,794 A * | 8/1998 | Hull | H05K 7/18 | 211/187 |
| 5,865,517 A * | 2/1999 | Wang | A47B 45/00 | 211/175 |
| 5,871,108 A * | 2/1999 | White | A47F 5/10 | 108/108 |
| 5,909,816 A * | 6/1999 | Gearin | B60P 3/07 | 211/85.8 |
| 5,938,047 A * | 8/1999 | Ellis | B65G 1/0442 | 211/1.57 |
| 6,247,601 B1 * | 6/2001 | Norton | B65D 85/48 | 211/41.14 |
| 6,298,999 B1 * | 10/2001 | Bellman | A47F 7/04 | 108/55.1 |
| 6,405,880 B1 * | 6/2002 | Webb | A47F 1/12 | 108/107 |
| 6,422,405 B1 * | 7/2002 | Haenszel | A47B 45/00 | 108/55.1 |
| 6,467,635 B1 * | 10/2002 | McComb | A47F 7/30 | 211/175 |
| 6,604,897 B2 * | 8/2003 | Yeomans | B65D 88/12 | 108/51.11 |
| 6,672,017 B2 * | 1/2004 | Larson | A47B 91/00 | 248/519 |
| 6,705,466 B2 * | 3/2004 | Bartholomew | B65D 85/48 | 206/386 |
| 6,722,292 B2 * | 4/2004 | Salmanson | A47B 57/22 | 108/107 |
| 6,747,204 B2 * | 6/2004 | DeLand | H02G 3/288 | 174/101 |
| D499,672 S * | 12/2004 | Thompson | D12/115 | |
| 6,834,768 B2 * | 12/2004 | Jersey | A47B 45/00 | 211/175 |
| 6,883,670 B2 * | 4/2005 | Moon | A47F 3/002 | 211/175 |
| 6,955,384 B1 * | 10/2005 | Good | E04G 5/004 | 296/3 |
| 7,055,833 B2 * | 6/2006 | Wixted | B62B 3/006 | 280/47.34 |
| 7,878,338 B2 * | 2/2011 | Maxson | E04G 5/004 | 211/41.15 |
| 8,002,128 B2 * | 8/2011 | Kern | B65D 19/12 | 211/194 |
| 8,360,708 B2 * | 1/2013 | Mashburn | B65G 1/0442 | 414/746.8 |
| 8,752,716 B2 * | 6/2014 | Gibson | B65D 85/48 | 211/41.14 |
| 8,875,909 B2 * | 11/2014 | Gerkensmeier | B65D 19/44 | 211/175 |
| 8,905,254 B2 * | 12/2014 | Joubert | B65D 19/12 | 220/1.5 |
| 8,919,363 B1 * | 12/2014 | Johnson | A47B 47/027 | 135/128 |
| 8,925,746 B2 * | 1/2015 | Johnson | H02G 3/00 | 211/94.02 |
| 9,285,138 B1 * | 3/2016 | Sasser | F24H 9/2071 | |
| 9,340,322 B2 | 5/2016 | Harris | A47B 47/028 | |
| 9,434,584 B2 * | 9/2016 | Parrish | B66F 9/06 | |
| 9,565,783 B1 | 2/2017 | Whitted et al. | | |
| 9,964,330 B2 * | 5/2018 | Son | F24F 13/20 | |
| 10,279,955 B2 * | 5/2019 | Bradley | E04H 6/00 | |
| 10,342,333 B2 * | 7/2019 | Keck | A47B 81/00 | |
| 2002/0020684 A1 * | 2/2002 | Gruber | A47B 47/027 | 211/189 |
| 2002/0075656 A1 | 6/2002 | Hastings et al. | | |
| 2003/0029818 A1 * | 2/2003 | Kamphuis | A47F 7/00 | 211/70.6 |
| 2003/0034320 A1 * | 2/2003 | Noh | A47F 5/10 | 211/189 |
| 2003/0180132 A1 * | 9/2003 | Morreim | B66C 19/005 | 414/458 |
| 2004/0245200 A1 * | 12/2004 | Jersey | A47B 81/007 | 211/189 |
| 2006/0016774 A1 * | 1/2006 | Bustos | A47B 57/04 | 211/186 |
| 2006/0118504 A1 * | 6/2006 | Willemsen | B65D 90/006 | 211/189 |
| 2007/0062899 A1 * | 3/2007 | Royalty | B65D 19/08 | 211/194 |
| 2007/0095775 A1 * | 5/2007 | Beck | B65D 19/12 | 211/194 |
| 2007/0215568 A1 * | 9/2007 | Heinrichs | B65D 88/522 | 211/191 |
| 2007/0278169 A1 * | 12/2007 | Grainger | B65D 19/08 | 211/186 |
| 2009/0266777 A1 * | 10/2009 | Porter, Sr. | A47F 7/0021 | 211/85.7 |
| 2009/0321371 A1 * | 12/2009 | Rathbone | H05K 7/1491 | 211/26.2 |
| 2010/0200528 A1 * | 8/2010 | Tourdot | B65G 1/10 | 211/86.01 |
| 2011/0122561 A1 | 5/2011 | Pierson et al. | | |
| 2013/0105428 A1 * | 5/2013 | Yaniak | B62B 1/10 | 211/168 |
| 2013/0120941 A1 * | 5/2013 | Peterson | H05K 7/1492 | 361/724 |
| 2013/0201618 A1 | 8/2013 | Czamara et al. | | |
| 2013/0233812 A1 * | 9/2013 | Anzola | B66F 9/12 | 211/49.1 |
| 2014/0175251 A1 * | 6/2014 | Potter | H01L 31/02 | 248/544 |
| 2014/0305893 A1 * | 10/2014 | Beach | B65G 1/02 | 211/71.01 |
| 2015/0076976 A1 | 3/2015 | Bailey et al. | | |
| 2015/0159359 A1 | 6/2015 | Parizeau et al. | | |
| 2015/0305498 A1 * | 10/2015 | Sue | A47B 81/00 | 211/60.1 |
| 2015/0334866 A1 * | 11/2015 | Bailey | H05K 7/183 | 312/223.2 |

\* cited by examiner

MODULAR DATA CENTER SUPPORT RACK SYSTEM AND INSTALLATION METHOD

FIELD

This invention generally relates to overhead-mounted data center rack systems for supporting the cables, bus bars, and switches necessary to power the servers and other digital equipment in a data center. It is specifically directed toward a support rack system formed from individual modular racks assembled onto a transportable fixtures in a factory that reinforce the modular racks during transportation to a data center.

BACKGROUND

Systems for supporting the electrical components necessary to power the large amounts of computer equipment in data centers are known in the prior art. Such prior art systems typically include rows of support brackets mounted either on the ceilings or support walls of the data center above the rows of server racks and other data-processing equipment. The support brackets may have multiple pairs of horizontally-oriented support arms that support bus bars, manual switch boxes, and cable trays holding multiple electrical power and communication cables. Such electrical power support systems are usually installed by first mounting the support brackets on the ceilings or support walls over the server racks and other data-processing equipment. Next, the brackets are unitized into long, shelf-like structures by the installation of cable trays and support rails between the support arms of adjacent brackets. Bus bars are connected between adjacent brackets, and switch boxes and other components are then lifted up and secured across the unitized support brackets. Finally, power and communication cables are lifted up, dropped into the cable trays, pulled along the cable trays to properly position them, and connected to the server racks and other data-processing equipment located underneath.

SUMMARY

While such prior art electrical power supply support systems fulfill their intended purpose, they are time-consuming and difficult to construct, for two reasons. First, in order to clear the top ends of the stacks of computers and other equipment that form the servers, the support brackets, support rails, cable trays, bus bars, switch boxes and cables must all be lifted and installed between about 12 and 24 feet above floor level. Such construction necessitates the use of scaffolds and ladders to provide access for construction workers to assemble the support brackets into unitized, shelf-like structures. Additionally, lifting equipment such as forklifts and pulleys must be used to lift the relatively heavy components of the system in order to position them for installation. For example, the combined weight of the data communication cables and copper-laden power cables alone can amount to as much as 134 lbs. per linear foot, even not considering the additional weight of the bus bars and switch boxes. This is not only work-intensive, but dangerous as well in view of the hazards that any dropped components would present to construction workers below. Second, the limited space available for constructing such prior art support systems further adds to the time and effort necessary to install them. Much of the floor space in data center buildings is taken up by large, floor-mounted ventilator plenums that are necessary to remove the heat generated by the large number of stacked computer servers. Consequently, the aisle ways between the opposing walls of adjacent ventilator plenums that accommodate two opposing rows of servers are only about 10 feet wide. Since the support arms of the support brackets typically extend about two and a half feet from walls where the support brackets are mounted, only about 5 feet of aisle way space is available to complete a second power supply support system over a second row of servers after a first power supply support system has been installed. The relatively confined space that the construction workers have to assemble a second row power component support system makes the assembly process longer and more awkward than it otherwise would be, and increases the probability of injuries due to dropped components and falls.

Accordingly there is a need for an improved power component support system that is faster and easier to construct. Ideally, such a system would obviate the need for construction at elevated heights within narrow, space-constraining aisle ways. Also, such a system should substantially reduce the safety hazards associated with dropped components and falls.

To these ends, the data center system of the invention comprises a plurality of modular support racks that support data center electrical power components, and a transportable fixture that facilitates assembly and transportation of the completed modular support racks and that mechanically reinforces the resulting, component-laden racks during transportation and installation. Each modular support rack comprises two or more vertically-oriented rack members having two or more pairs of horizontally-oriented support arms. The rack members are detachably connected to the transportable fixture into proper alignment, and then assembled together into shelf-like structures via tying members. Next, cable trays and power components such as bus bars and switch boxes are assembled onto the rack members. All of these assembly steps are conducted remotely from the data center in a factory designed to facilitate such assembly. The resulting combination of completed modular rack and fixture then transported to and lifted into an installation position on a data center support wall as a unitized whole. During this time, the fixture advantageously reinforces the component-laden modular support rack as it experience the jostling and other temporary stresses associated with transportation and installation. The fixture further helps to prevent any accidental falling-off of power components from the modular rack. After the modular rack has been installed in the data center, the transportable fixture is removed and recycled back to the factory for use in assembling another modular support rack.

The transportable fixture may include a base, and a frame mounted on the base. The base preferably includes a portion such as a recess that receives, for example, the fork of a forklift that transports the fixture along with an assembled modular support rack. The frame mounted on the base detachably connects to the at least two rack members into a position for assembly of the modular support rack. The frame of the transportable fixture includes connecting members that are alignable with and detachably connectable to the at least two horizontally-oriented support arms of each of the rack members. These connecting members may include elongated, tubular members that are slidable over and fixable to the horizontally-oriented support arms in telescopic fashion to provide a quick and mechanically strong interconnection. These connecting members extend orthogonally from vertical support posts such that the frame of the fixture vertically interconnects the distal ends of the horizontal support arms of the rack members, which not only mechanically reinforces the arm members but also provides a barrier that prevents any of the power components from falling off of the modular rack during transportation and installation.

Each of the plurality of modular support racks includes an arrangement of data center electrical power supply components that are mechanically and electrically registrable with and connectable to another arrangement of data center electrical power supply components on another of the support racks. This allows the electrical supply components of a row of the modular support racks to be serially interconnected into an appropriate electrical supply configuration for the row of servers located beneath the row of modular support racks.

In the method of the invention, each of the modular data racks is first assembled in one of the transportable fixtures. This is accomplished by slidably connecting the horizontal supports of the rack members into the tubular connecting members of the fixture. Next, the rack members are interconnected by the horizontal tying members. Horizontal support rails for the manual switch boxes and cable support trays are next bolted or otherwise secured across the horizontal support arms of the rack members. The modular support rack is then substantially completed by the installation of a pre-selected configuration of bus bars, switch boxes, and other components on the support arms and horizontal support rails.

Next, each of the modular support racks along with its interconnected fixture is transported to an installation location, such as a support wall within a data center. The modular support racks are serially mounted about 12 feet above floor level in a pre-selected order that allows their electrical supply components to be serially interconnected into an appropriate electrical supply configuration for the row of servers to be installed beneath. All during the transportation and installation of the modular support rack, (and the accompanying jolts, jostling, and vibrations) the interconnected fixture provides mechanical reinforcement to the support arms of the rack members, which may be carrying a combined load of 1,000 lbs. in bus bars and switch boxes and conduits.

After each of the modular support racks is secured into position on the support wall of the data center, its respective fixture is disconnected, removed, and recycled for use on another modular support rack. Power and communication cables are lifted and laid into the cable trays, and the bus bars and switch boxes of adjacent modular racks are interconnected to provide an appropriate electrical supply configuration for the row of servers located beneath the row of modular support racks.

DETAILED DESCRIPTION OF THE PREFERRED EMBODIMENT

Figure 1:
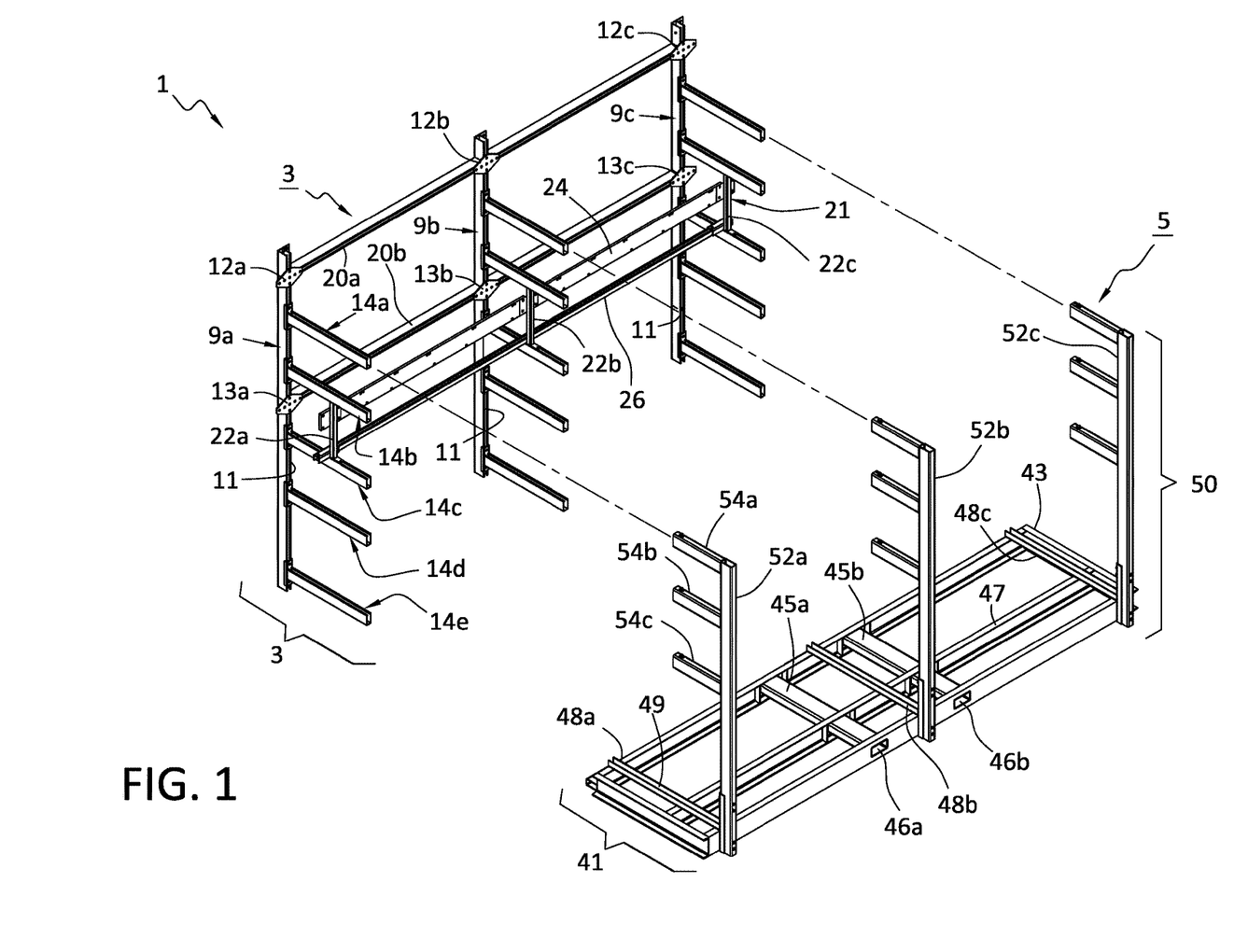
FIG. 1 is a perspective view of an assembled modular support rack (shown without power components for clarity) and the transportable fixture of the data center support rack system of the invention.

With reference to FIG. 1, the modular data center support rack system 1 generally includes multiple modular support racks 3, and one or more transportable fixtures 5 that are used to both assemble, transport, and install the support racks 3.

In this embodiment of the invention, each support rack 3 includes three vertically-oriented rack members 9a, 9b, and 9c. Preferably, each rack member 9a-c is formed from Unistrut® tubular steel for its relatively high strength and low weight. Each of the rack members 9a-c includes a mounting slot 11 along one of its sides for receiving fasteners, as will be explained in more detail hereinafter. A pair of mounting plates 12 and 13 are welded near the top and middle of each of the rack members 9a-c as shown. Each of the rack members 9a-c further includes a plurality of horizontally-extending support arms 14a-e. The support arms 14a-e are preferably all the same length and are parallel to one another. Like the rack members 9a-c from which they extend, each of these support arms 14a-e is formed from Unistrut® tubular steel and has a mounting slot 15 on its upper side for receiving fasteners. A U-shaped base connector is welded on the proximal end of each of the support arms 14a-e as shown. Each support rack 3 further includes a pair of horizontally-oriented tying members 20a, 20b that interconnect the rack members 9a-c. The tying members 20a, 20b are bolted onto the rack members 9a-c via the mounting plates 12 and 13 present on each of the rack members.

Figure 2A:
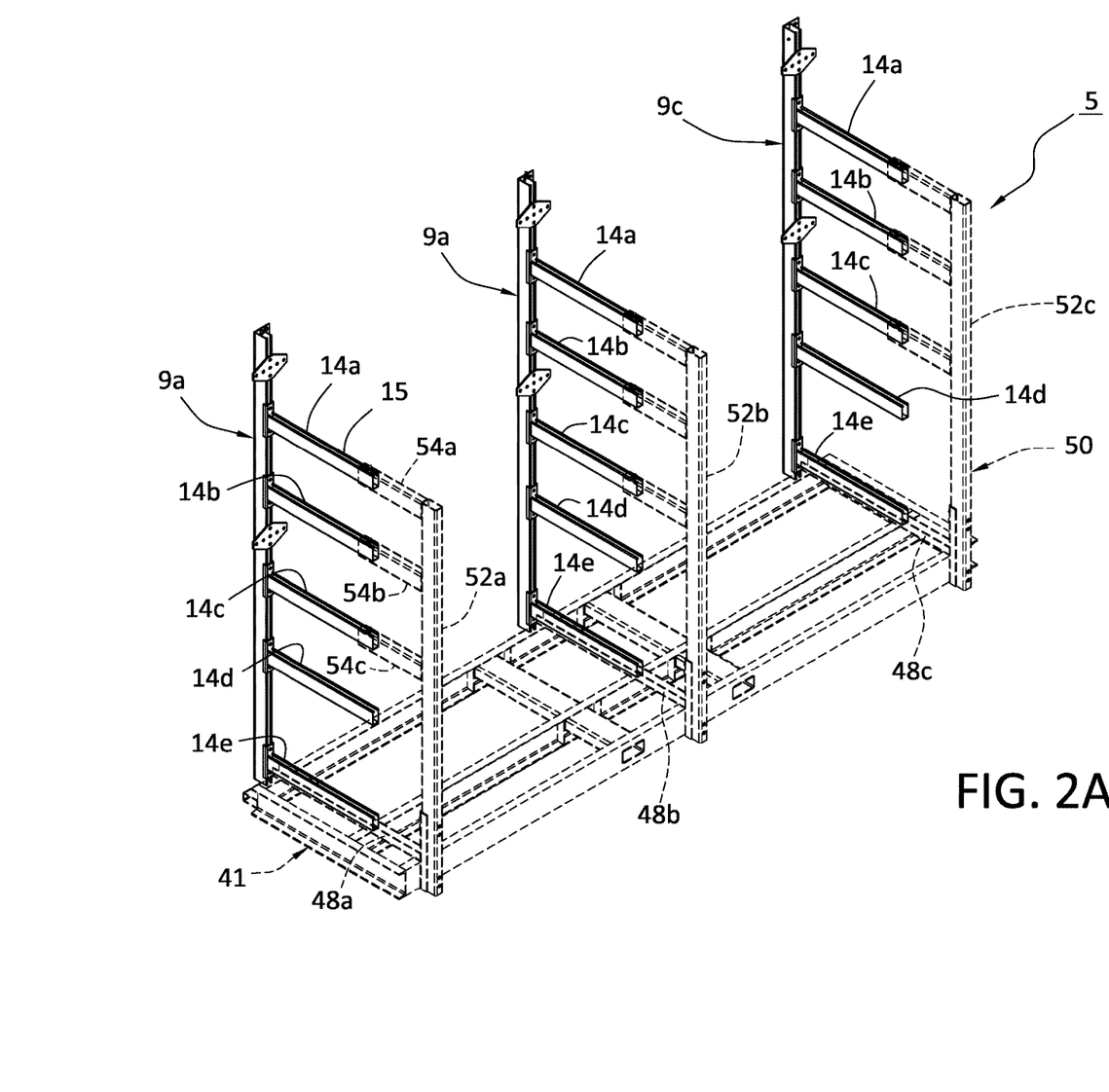
FIG. 2A is a perspective view of the first step of the assembly and installation method of the invention, illustrating how the vertically-oriented rack members of a support rack are detachably connected on the transportable fixture in the first assembly step.
Figures 2B, 2C, 2D:
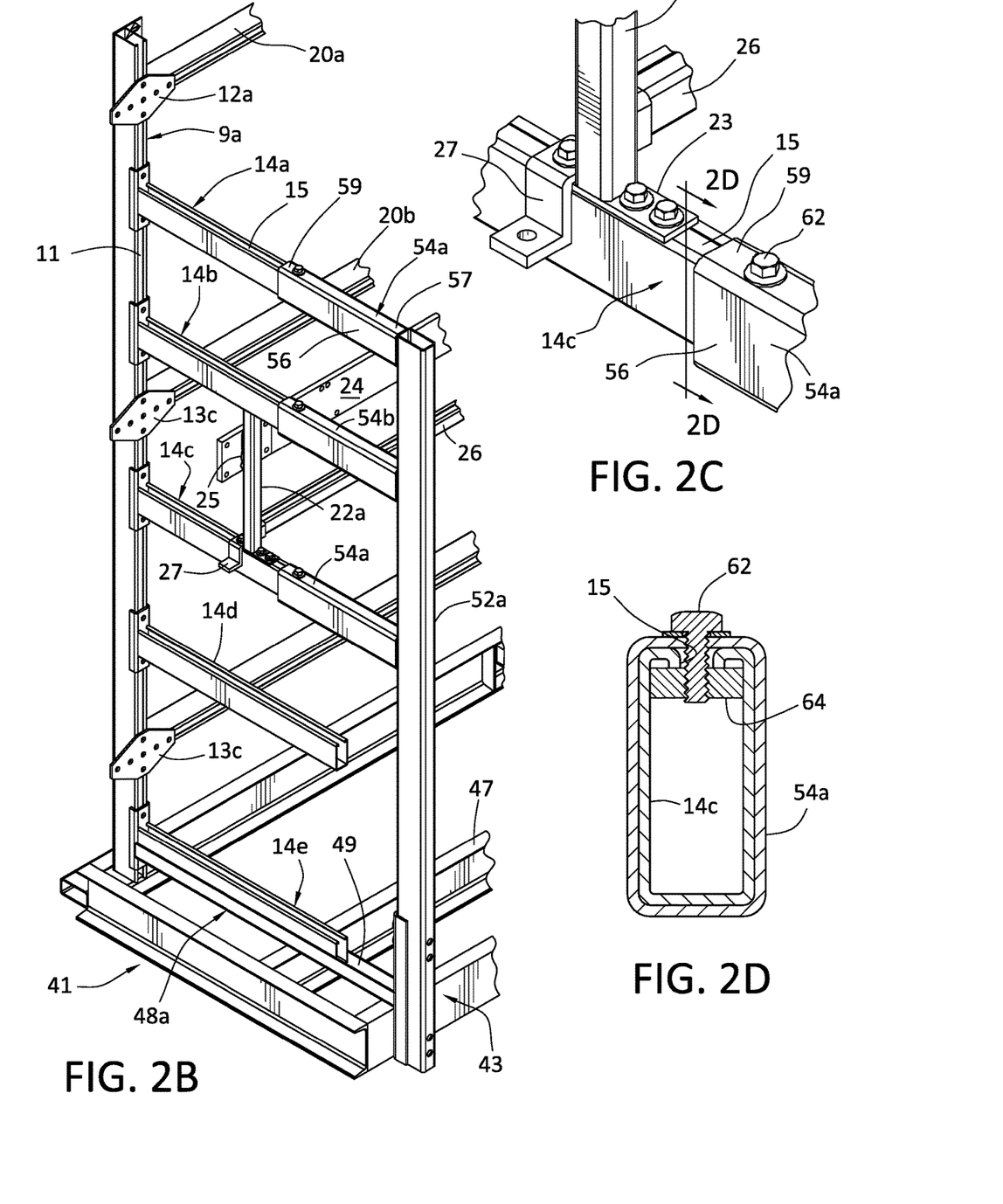
FIGS. 2B and 2C are enlarged views of the telescopic interconnection between the horizontally-oriented support arms of the rack members and the tubular connecting members of the transportable fixture.
FIG. 2D is a cross-section of the support arm shown in FIG. 2C along the line 2D-2D.

With reference to FIG. 1 and FIGS. 2B-2C, a switch box support assembly 21 is further provided in each support rack 3. In this embodiment, the switch box support assembly 21 is formed from three vertical support posts 22a-c affixed across the second and third support arms 14b, 14c of each of the vertically-oriented rack members 9a-c. The upper and lower ends of each of the support posts 22a-c each include a mounting flange 23 (of which only the lowermost flange 23 is visible) which are respectively bolted onto the support arms 14*b* and 14*c*. The switch box support assembly 21 further includes a horizontally-oriented support plate 24 welded across all three support posts 22*a-c* via welds 25, and a horizontally-oriented support rail 26 formed from the same Unistrut® tubular steel material that the rack members 9*a-c* are formed from. The support rail 26 is affixed in place via mounting brackets 27 bolted onto the support arm 14*c* of the side rack members 9*a* and 9*c*. The mounting brackets 27 each have a socket 28 that receives an end of the rail member 26.

Figure 5A:
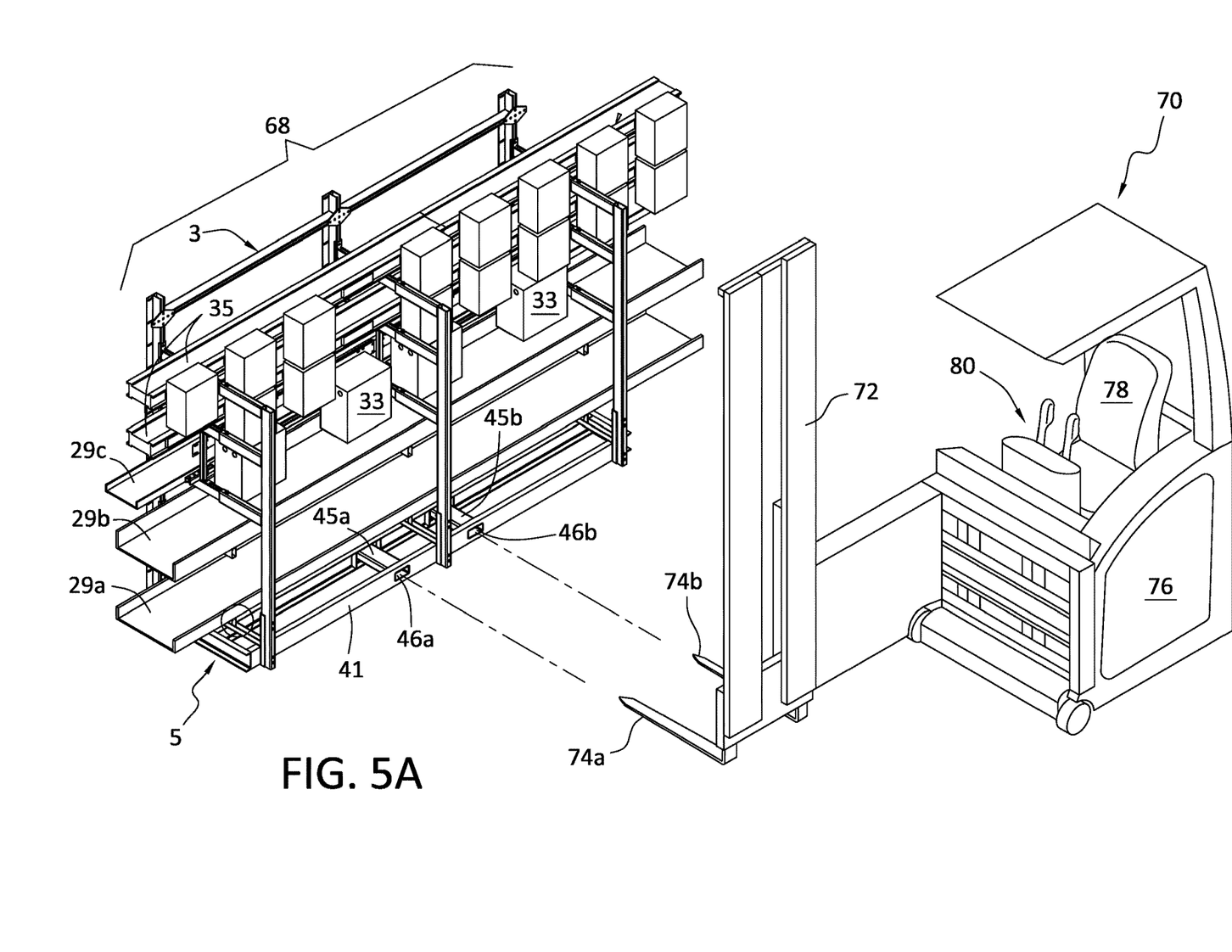
FIG. 5A is a perspective view of the fourth step of the inventive method, illustrating how the cable trays and electrical power supply components are mounted across the across the support arms of the rack members in order to complete one of the modular support racks, and how the fork-receiving recesses in the transportable fixture are alignable with the lifting fork of a forklift.
Figure 5B:
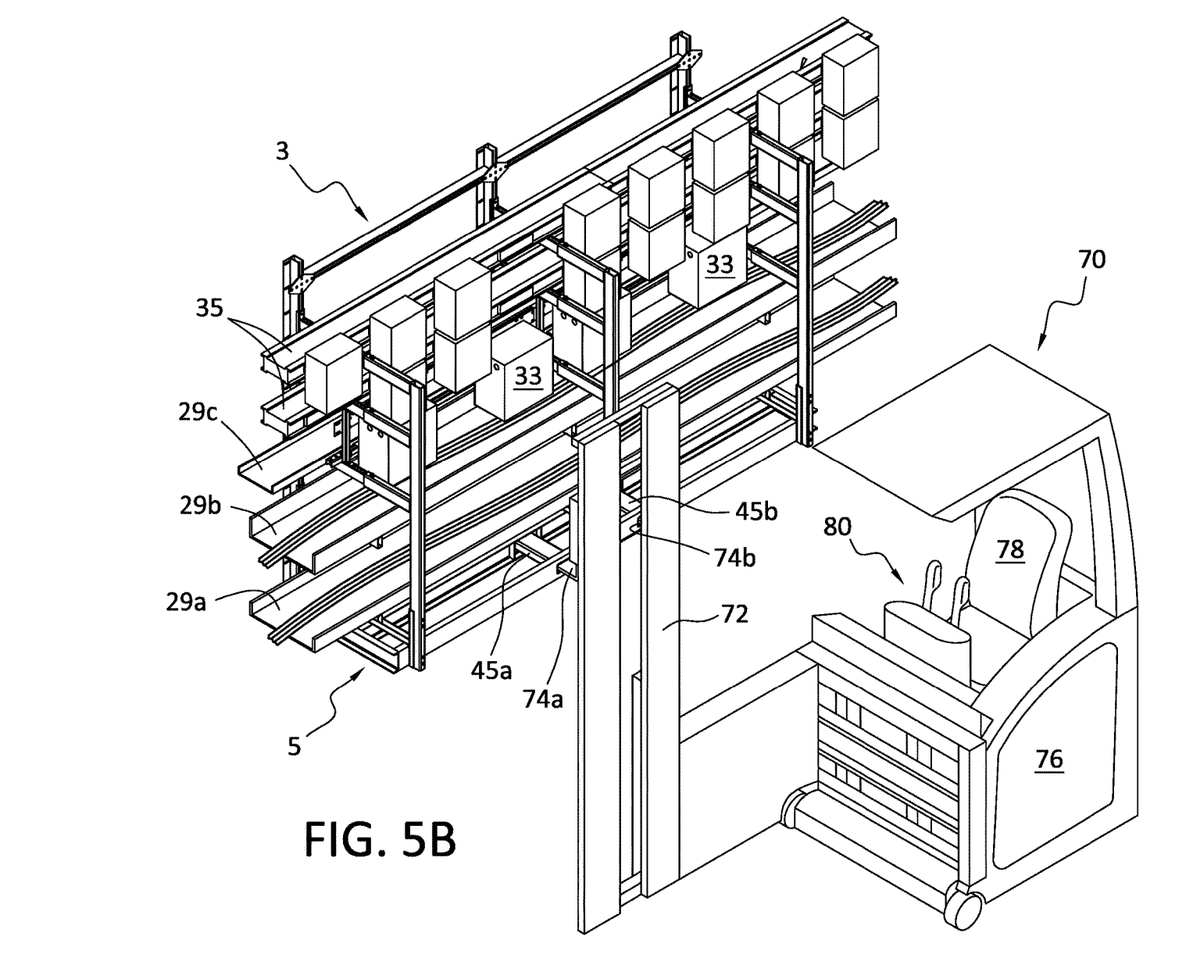
FIG. 5B is a perspective view of the fifth step of the inventive method, illustrating how the transportable fixture remains connected to the completed modular support racks during the transportation of the support racks.

With reference now to FIGS. 5A and 5B, each of the support racks 3 preferably includes cable trays 29*a-c* which are bolted or otherwise affixed across the support arms 14*e*, 14*d*, and 14*c*, respectively. Finally, each of the support racks 3 includes electrical power components which may take the form of manual switch boxes 33 mounted on the switch box support assembly 21, bus bars 35 mounted across the support arms 14*a* and 14*b*, and power and communication cables 37 (shown in FIG. 7) which are laid into the cable trays 29*a-c* after the support racks 3 have been installed on a support wall of a data center.

Turning now to the transportable fixtures 5 of the system, and with reference to FIG. 1 and FIGS. 2B-2D, each fixture 5 includes a base 41, and a frame 50 attached to and extending upwardly from the base 41.

The base 41 of each fixture 5 is formed from a rectangular platform 43 of C-channel steel material welded together at the corners. A pair of tubular fork-receiving members 45*a*, 45*b* terminating in open ends 46*a*, 46*b* are welded across the rectangular platform 43 in parallel as shown. The fork-receiving members 45*a*, 45*b* are spaced apart the same distance as the forks of a forklift so as to slidably receive the same. The fork-receiving members 45*a*, 45*b* are further spaced equidistantly from a center of mass of the rectangular frame so as to balance the load exerted on the forks of a forklift. A lengthwise reinforcing member 47 is welded at either end to the inside ends of the platform 43 and serves to reinforce both the platform 43 and the fork-receiving members 45*a*, 45*b*. Finally, three cross-struts 48*a-c* are welded cross-wise on the rectangular platform 43. These cross-struts 48*a-c* further reinforce the platform 43. Additionally, each of these cross-struts has a "U" shaped cross section complimentary in shape to the bottom-most support arms 14*e* of each of the rack members 9*a-c* so as to slidably receive and support the same during the assembly of the support racks 3.

The frame 50 of each fixture 5 is formed from three vertical posts 52*a-c*. Each of the posts 52*a-c* is preferably formed from tubular steel material having a rectangular cross section. The bottom end of each of the posts 52*a-c* is bolted or otherwise rigidly affixed to the platform 43. Each of the posts 52*a-c* includes three horizontal connecting arms or members 54*a-c* which are likewise preferably formed from a tubular steel material having a rectangular cross section. As shown in FIG. 2B, the proximal end 57 of each of the connecting members 54*a-c* is welded to its respective post 52*a-c*. As indicated in FIGS. 2A, 2B, and 2C, the open, distal end 59 of each of the connecting members 54*a-c* is capable of receiving the distal ends of the support arms 14*a-c*. As is specifically shown in FIG. 2D, the inner perimeter 60 of the connecting members 54*a-c* is complimentary in shape to the outer perimeter 61 of the support arms 14*a-c* such that the support arms 14*a-c* can telescopically slide into the connecting members 54*a-c*. The combination of a clamping bolt 62 and T-nut 64 detachably fastens the support arms 14*a-c* of a support rack 3 to the connecting members 54*a-c* of its respective fixture 5 during the assembly and installation of the support rack 3, as is explained in more detail hereinafter.

In addition to the previously-described modular support rack system 1, the invention also includes an assembly and installation method for such a system. In the first step of the method, assembly of a modular support rack 3 is commenced by attaching three rack members 9*a-c* to the fixture 5. This is accomplished by aligning the distal ends of the top three support arms 14*a-c* with the open distal ends 59 of the connecting members 54*a-c* of the fixture 5, and the bottommost support arms 14*e* of the rack members 9*a-c* with the U-shaped grooves 49 present in the cross-struts 48*a-c* present on the base 41 of the fixture 5. Next, the support arms 14*a-c* and 14*e* are slid into the connecting members 54*a-c* and grooves 49 of the cross-struts 48*a-c* in telescopic fashion into the position illustrated in FIG. 2A. The clamping bolt 62 of each of the connecting members 54*a-c* is then tightened to bring the T nut into the position illustrated in FIG. 2D, thereby squeezing the top sides of the support arms 14*a-c* into frictional engagement with the top sides of the connecting members 54*a-c*. It should be noted that this step not only detachably connects the rack members 9*a-c* to the fixture 5, but also properly spaces and orients the rack members 9*a-c* so that the connecting interfaces (such as bolt holes) between the rack members 9*a-c* and the remaining components of the support rack 3 are pre-aligned for easy assembly.

Figure 3:
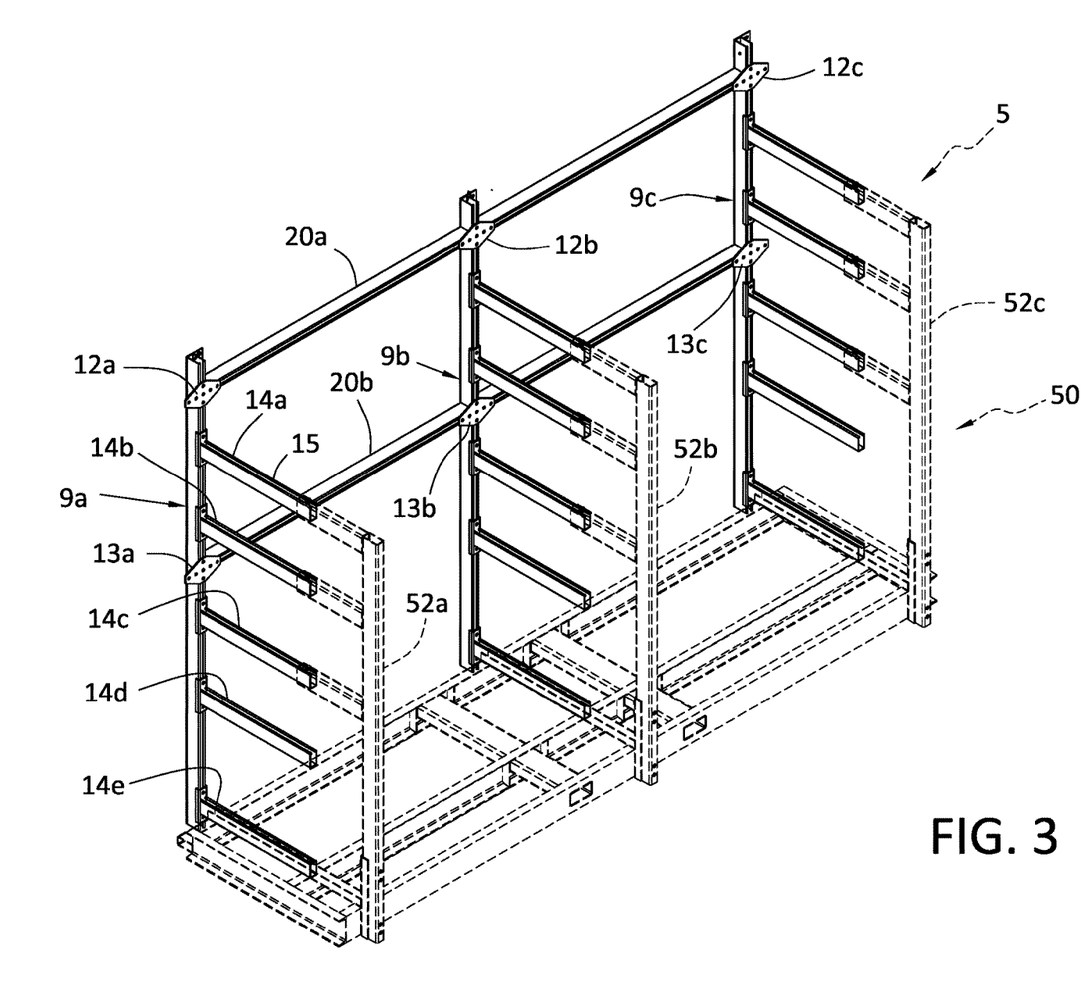
FIG. 3 is a perspective view of the second step of the inventive method, illustrating how the rack members are interconnected by horizontally-oriented tying members.
Figure 4:
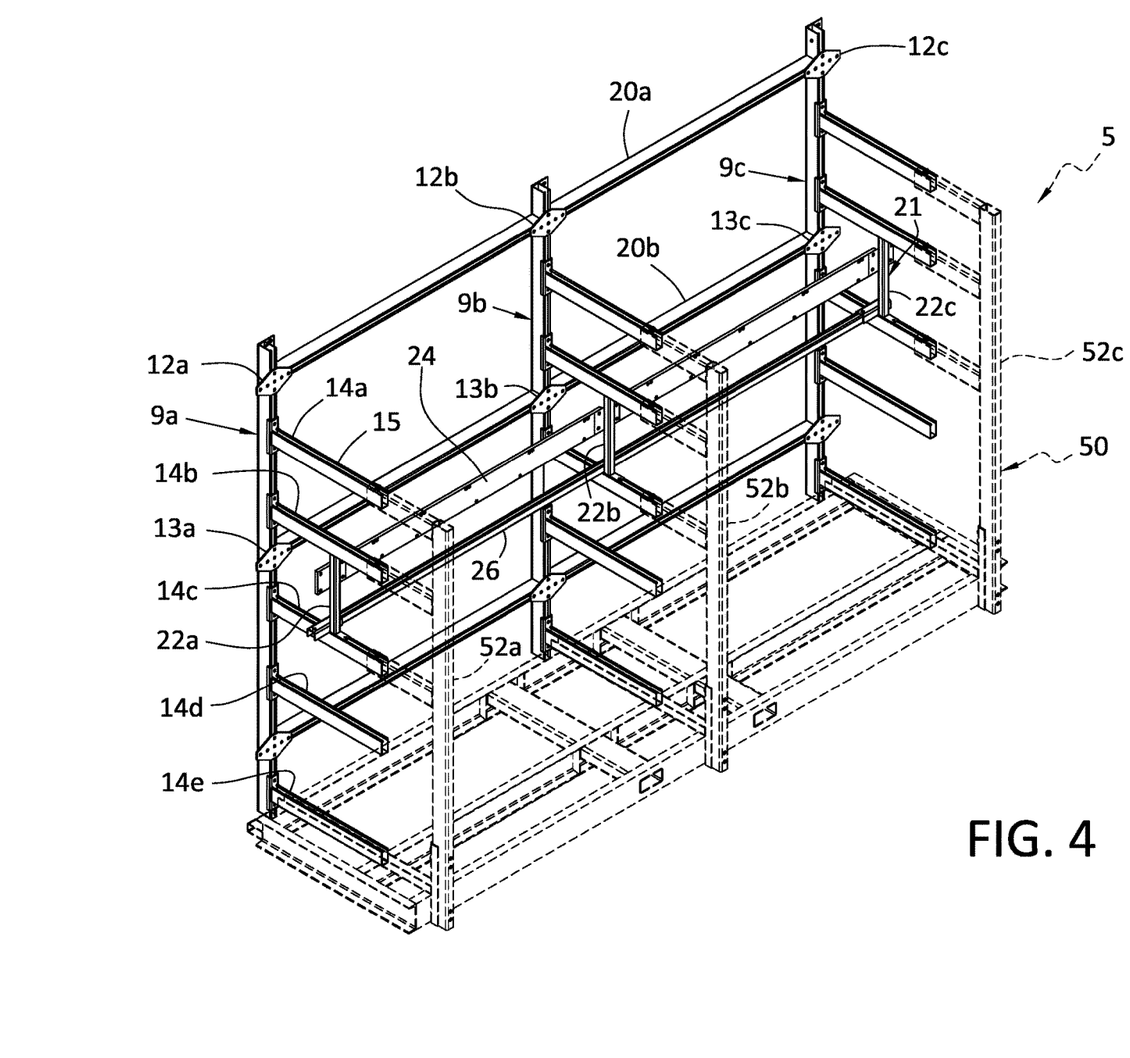
FIG. 4 is a perspective view of the third step of the inventive method, illustrating how the support rails for the manual switch boxes are installed across the support arms of the rack members.

Next, as shown in FIG. 3, the tying members 20*a*, 20*b* are attached across the rack members 9*a-c* by bolting the ends and the center of each of these components to the mounting plates 12*a-c*. This step unitizes the rack members 9*a-c* and defines the basic frame of the modular rack 3. Next, as shown in FIG. 4, the switch box support assembly 21 is assembled across the unitized rack members 9*a-c*. This is accomplished by first connecting the upper and lower mounting flanges 23 of the support posts 22*a-c* to the support arms 14*b* and 14*c*, respectively. Support plate 24 is then welded to the support posts 22*a-c*, followed by the bolting of the support rail 26 into the position indicated in FIG. 4 via the mounting brackets 27 as previously described. Next. As indicated in FIG. 5A, the cable shelves 29*a*, 29*b*, and 29*c* are bolted or otherwise affixed across the support arms 14*e*, 14*d*, and 14*c*, respectively. These steps complete the frame of the modular rack 3.

In the final steps of the assembly of each of the racks 3, the electrical power and communication components are assembled onto the rack frame. As shown in FIG. 5A, these components include, for example, manual switch boxes 33 (which are installed onto the switch box support assembly 21) and bus bars 35, although any number of other types of electrical components are within the purview of this invention. It should be noted that the specific types of electrical components and their specific arrangement is preselected for each of the assembled modular support racks 3 so that when the plurality of modular support racks 3 are linearly arranged in a specific order, the electrical components of one modular support rack are mechanically and electrically registrable with and connectable to the data center electrical power supply components on adjacent modular support racks 3.

The completion of the aforementioned assembly steps results in a combination support rack and fixture structure 68 in which the fixture 5 substantially reinforces the mechanical strength of the modular support rack 3 to which it is connected. This important, as the off-site assembly of the modular racks 3 requires that they be transported to their final destination and lifted into a specific installation location, all of which necessarily applies momentary stresses and loads onto the support arms 14a-e due to the jostling and momentary shocks that inevitably accompany such movement. Additionally, the tubular fork-receiving members 45a, 45b of the base 41 of the fixture 5 provides a convenient and robust attachment point for the fork of a forklift, greatly facilitating the transporting, lifting, and installation of the modular data racks 3 onto the support wall of a data center.

Figure 6:
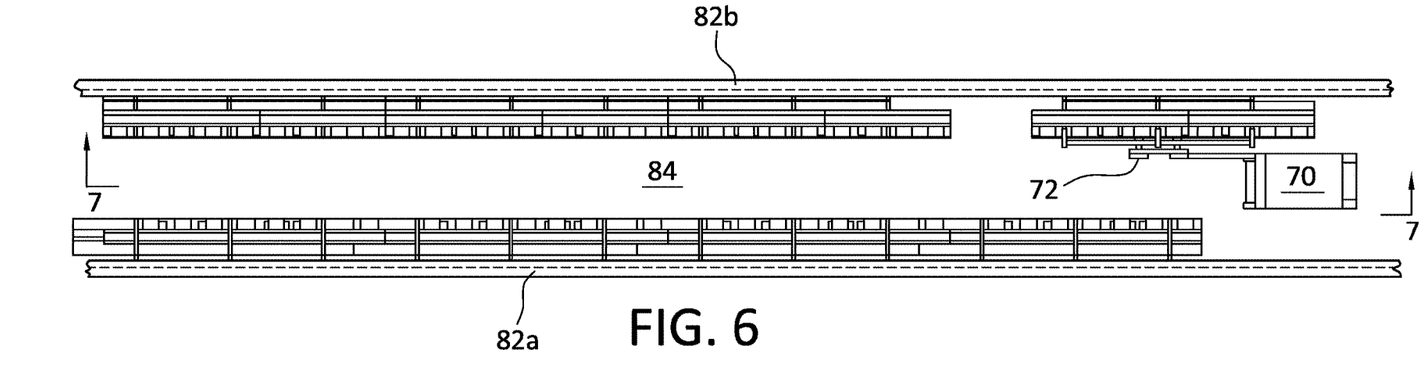
FIGS. 6 and 7 are a plan view and a side view, respectively of the final steps of the inventive method, illustrating how the completed modular support racks are installed on an upper portion of a data center support wall in linear alignment, with the electrical power components of each modular rack electrically and mechanically connected to the electrical power components of the adjacent modular rack to provide an appropriate electrical supply configuration for the row of servers located beneath the row of modular support racks.
Figure 7:
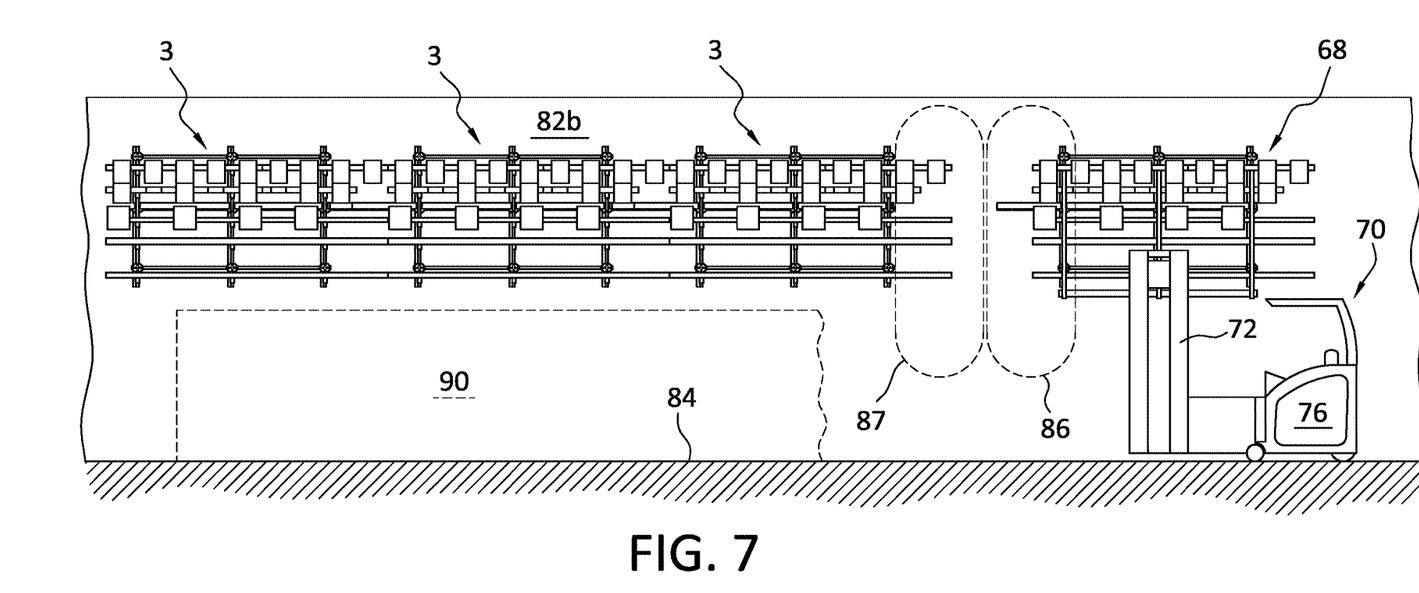

FIGS. 5A-7 illustrate the final steps of the method of the invention. Specifically, FIGS. 5A and 5B illustrate how a forklift 70 having a lifting assembly 72 slidably inserts the forks 74a, 74b into the openings 46a, 46b of the fork receiving members 45a, 45b, and lifts the completed combination support rack and fixture structure 68. The forklift 70 then proceeds to move the combination structure 68 onto the bed of a transportation vehicle, such as a truck (not shown) which transports the combination structure 68 to a data center remotely located from the assembly site. As indicated in FIGS. 6 and 7, after the combination structure 68 is delivered to a data center 80, the forklift 70 transports the combination structure 68 to its assigned installation location on one of the support walls 82B of the data center. In this particular step, the forklift 70 is preferably a side loader forklift due to the space constraints imposed by the aisle ways 84. As is best seen in FIG. 7, the combination structure 68 is then lifted into its installation location, and bolted or otherwise secured to the support wall 82b. The arrangement of the electrical power components on the united structure 68, and its specific location in the linear arrangement of the modular racks 3, has been pre-selected so that the electrical power components on the right side 87 of the installed modular rack 3 are mechanically and electrically registrable with the electrical power components on the left side 86 of the combined structure 68. As a result, the modular support racks 3 may be interconnected to form a power supply arrangement compatible with a row of servers and other data processing equipment 90 that will be installed beneath the linear arrangement of modular racks 3.

After the combined structure 68 is mounted in it installation location on the support wall 82b, the fixture 5 is detached from the installed modular rack 3 by loosening the clamping bolts 62 and slidably withdrawing the connecting members 54a-c from the support arms 14a-c. The fixture 5 is then recycled to assemble and install another modular support rack 3.

Although the invention has been described in detail with particular reference to a preferred embodiment, it will be understood that variations and modifications can be effected within the spirit and scope of the invention. For example, the frame 50 of the transportable fixture 5 may assume a variety of alternative forms to fulfill its two-fold function of facilitating the assembly of the modular support rack 3 and reinforcing a completed rack 3 during transportation and assembly. In particular, the detachable connection between the fixture 5 and the modular rack 3 may be implemented via snap-fit, spring loaded detents, or via simple pipe-type couplings wherein an annular, rotatable threaded coupling is screwed over a threaded distal end of the horizontal support arms of the modular rack. Other modifications, variations, and additions to the invention will become apparent to persons of skill in the art, and all such modifications, variations, and additions are intended to be within the scope of this invention, which is limited only by the claims appended hereto and their various equivalents.

The invention claimed is:

1. A modular data center support rack system, comprising:
a plurality of modular support racks configured to support data center electrical power components, each of which includes at least one rack member, and
at least one transportable fixture configured to facilitate the assembly of at least first and second modular support racks and to reinforce the completed modular support racks during transportation and installation in a data center building, the transportable fixture including:
a base, and
a frame mounted on the base configured to detachably connect to the at least two rack members to facilitate assembly of the first modular support rack, and that reinforcingly engages the first modular support rack during the transportation and installation thereof in the data center building such that the frame of the transportable fixture is disconnected from the first modular support rack after the installation thereof and recycled for use in facilitating assembly and reinforcingly engaging the second modular support rack.

2. The modular data center support rack system defined in claim 1, wherein each of the plurality of modular support racks includes an arrangement of data center electrical power supply components that are mechanically and electrically registrable with and connectable to another arrangement of data center electrical power supply components on another of the plurality of modular support racks.

3. The modular data center support rack system defined in claim 2, wherein the data center electrical power components include one or more from the group consisting of bus bars, switch boxes, cable trays, cables, and conduits.

4. The modular data center support rack system defined in claim 1, wherein the base of the at least one transportable fixture includes a portion for receiving a lifting and lowering member of a vehicle that transports the at least one transportable fixture with a modular support rack detachably connected thereto.

5. The modular data center support rack system defined in claim 1, wherein each of the modular support rack includes at least two rack members that are vertically-oriented and also includes at least one pair of horizontally-oriented support arms, and wherein each of the plurality of modular support racks further includes at least one tying member that interconnects the at least two vertically-oriented rack members, and wherein the frame of the at least one transportable fixture holds the at least two rack members into a position for the assembly of the tying member to the at least two rack members.

6. The modular data center support rack system defined in claim 5, wherein the frame of the at least one transportable fixture includes connecting members that are alignable with and detachably connectable to the at least one pair of support arms of each of the rack members.

7. The modular data center support rack system defined in claim 6, further comprising fasteners for affixing the connecting members of the frame of the at least one transportable fixture to the at least one pair of support arms of the vertically-oriented rack members after the connecting members and at least one pair of support arms are slid together.

8. The modular data center support rack system defined in claim 5, wherein the connecting members of the frame of the at least one transportable fixture are slidably connectable to the at least one pair of support arms of each of the rack members.

9. The modular data center support rack system defined in claim 5, wherein the connecting members of the frame of the at least one transportable fixture are elongated, tubular members that are slidable over the at least one pair of support arms of each of the rack members.

10. A modular data center support rack system, comprising:
   a plurality of modular support racks configured to support data center electrical power components, each of which includes at least two vertically-oriented rack members, each of which includes at least one pair of horizontally-oriented support arms vertically spaced apart from one another, and
   at least one transportable fixture for assembling and transporting each of the modular support racks, the fixture including
      a base including a portion for receiving a lifting and lowering member of a vehicle, and
      a frame mounted on the base that detachably connects to the at least two rack members into a position for assembly of the modular support rack, and that remains detachably connected to a modular support rack during the transportation thereof to an installation location to reinforce the mechanical strength of the modular support rack.

11. The modular data center support rack system defined in claim 10, wherein each of the plurality of modular support racks includes an arrangement of data center electrical power supply components that are mechanically and electrically registrable with and connectable to another arrangement of data center electrical power supply components on another of the plurality of modular support racks.

12. The modular data center support rack system defined in claim 10, wherein the data center electrical power components include one or more from the group consisting of bus bars, switch boxes, cable trays, cables, and conduits.

13. The modular data center support rack system defined in claim 10, wherein each of the plurality of modular support racks further includes at least one tying member that interconnects the at least two vertically-oriented rack members, and wherein the frame of the at least one transportable fixture holds the at least two rack members into a position for the assembly of the tying member to the at least two rack members.

14. The modular data center support rack system defined in claim 10, wherein the frame of the at least one transportable fixture includes connecting members that are detachably connectable to the at least one pair of support arms vertically spaced apart from one another of the vertically-oriented rack members.

15. The modular data center support rack system defined in claim 14, wherein the connecting members of the at least one transportable fixture are elongated members that are slidably connectable to the at least one pair of support arms of each of the vertically-oriented rack members.

16. The modular data center support rack system defined in claim 15, wherein the connecting members of the at least one transportable fixture are elongated, tubular members that are slidable over or within the at least one pair of support arms of each of the vertically-oriented rack members.

17. A method for assembling a modular data center support rack system that includes a plurality of modular support racks configured to support data center electrical power components, wherein each of the plurality of modular support racks includes at least two vertically-oriented rack members, comprising the steps of:
   (a) providing at least one transportable fixture including a base, and a frame mounted on the base that detachably connects to the at least two rack members into a position for assembly;
   (b) detachably connecting the transportable fixture to at least two vertically-oriented rack members to assemble a modular support rack that includes an array of electrical power components, and
   (c) lifting and transporting the at least one transportable fixture and the modular support rack detachably connected thereto to a support wall such that the mechanical strength of the modular support racks is reinforced during transportation.

18. The method for assembling a modular data center support rack system of claim 17, wherein each of the plurality of modular support racks further includes at least one horizontally-oriented tying member that interconnects the at least two vertically-oriented rack members, and further including the steps of (i) using the frame of the at least one transportable fixture to hold the at least two rack members into a position for the assembly of the tying member to the at least two rack members, and (ii) connecting the tying member to the at least two rack members.

19. The method for assembling a modular data center support rack system of claim 17, wherein a first modular support rack includes an arrangement of data center electrical components that are mechanically registrable with and electrically connectable to an arrangement of data center electrical power components on a second of the plurality of modular support racks that has been mounted on the support wall, further comprising the steps of:
   (a) transporting the first modular support rack and transportable fixture to the support wall adjacent to the second modular support rack;
   (b) mounting the arrangement of data center electrical power components of the first modular support rack in alignment with the arrangement of data center electrical power components of the second modular support rack;
   (c) detaching and removing the transportable fixture from the first modular support rack, and
   (d) electrically and mechanically connecting the arrangement of data center electrical power components of the first modular support rack with the arrangement of data center electrical power components of the second modular support rack.

20. A modular data center support rack system, comprising:
   a plurality of modular support racks configured to support data center electrical power components, each of which includes at least one rack member, and
   at least one transportable fixture for facilitating the assembly of the plurality of modular support racks and reinforcing the modular support racks during transportation and installation in a building, the transportable fixture including:
      a base, and
      a frame mounted on the base configured to connect to the at least one rack member of one of the plurality of modular support racks to facilitate assembly of the modular support rack, and to reinforcingly engage the modular support rack during the transportation and installation thereof in the building, and further configured to disconnect from the modular support rack after the installation thereof in the building such that the transportable fixture forms no part of the installed modular support rack.

* * * * *